United States Patent [19]

Duncan et al.

[11] 4,331,874
[45] May 25, 1982

[54] DC RESTORE CIRCUIT FOR CHARGE COUPLED DEVICES

[75] Inventors: James S. Duncan; Michael Y. Pines, both of Los Angeles, Calif.

[73] Assignee: Hughes Aircraft Co., Culver City, Calif.

[21] Appl. No.: 165,179

[22] Filed: Jul. 2, 1980

[51] Int. Cl.³ .............................................. G01J 1/00
[52] U.S. Cl. ..................................... 250/347; 250/349
[58] Field of Search ............... 250/332, 334, 347, 349, 250/370, 371; 307/221 R; 311; 357/30

[56] References Cited

U.S. PATENT DOCUMENTS

| | | | |
|---|---|---|---|
| 3,808,435 | 4/1974 | Bate et al. | 250/349 X |
| 3,886,359 | 5/1975 | Cheek, Jr. et al. | 250/347 X |
| 4,225,883 | 9/1980 | Van Atta et al. | 250/334 X |
| 4,276,474 | 6/1981 | Crawford | 250/349 |

*Primary Examiner*—Davis L. Willis
*Attorney, Agent, or Firm*—R. M. Wallace; W. H. MacAllister

[57] ABSTRACT

As CCD circuit for restoring to a common DC level, data received from a plurality of detector channels of a scanned array so as to overcome the effect of variations in detector parameters and other non-uniformities in the circuit. The DC correction value is established during retrace time by storing a representative time integrated data charge packet when energy from a cold reference surface is being applied to the detectors. During the scan time of the field of view by the detectors the representative charge packet is utilized to provide a DC restoration or correction charge to each data charge packet received from the detectors. The system thus standardizes to a common DC level, the output data from a plurality of channels.

12 Claims, 12 Drawing Figures

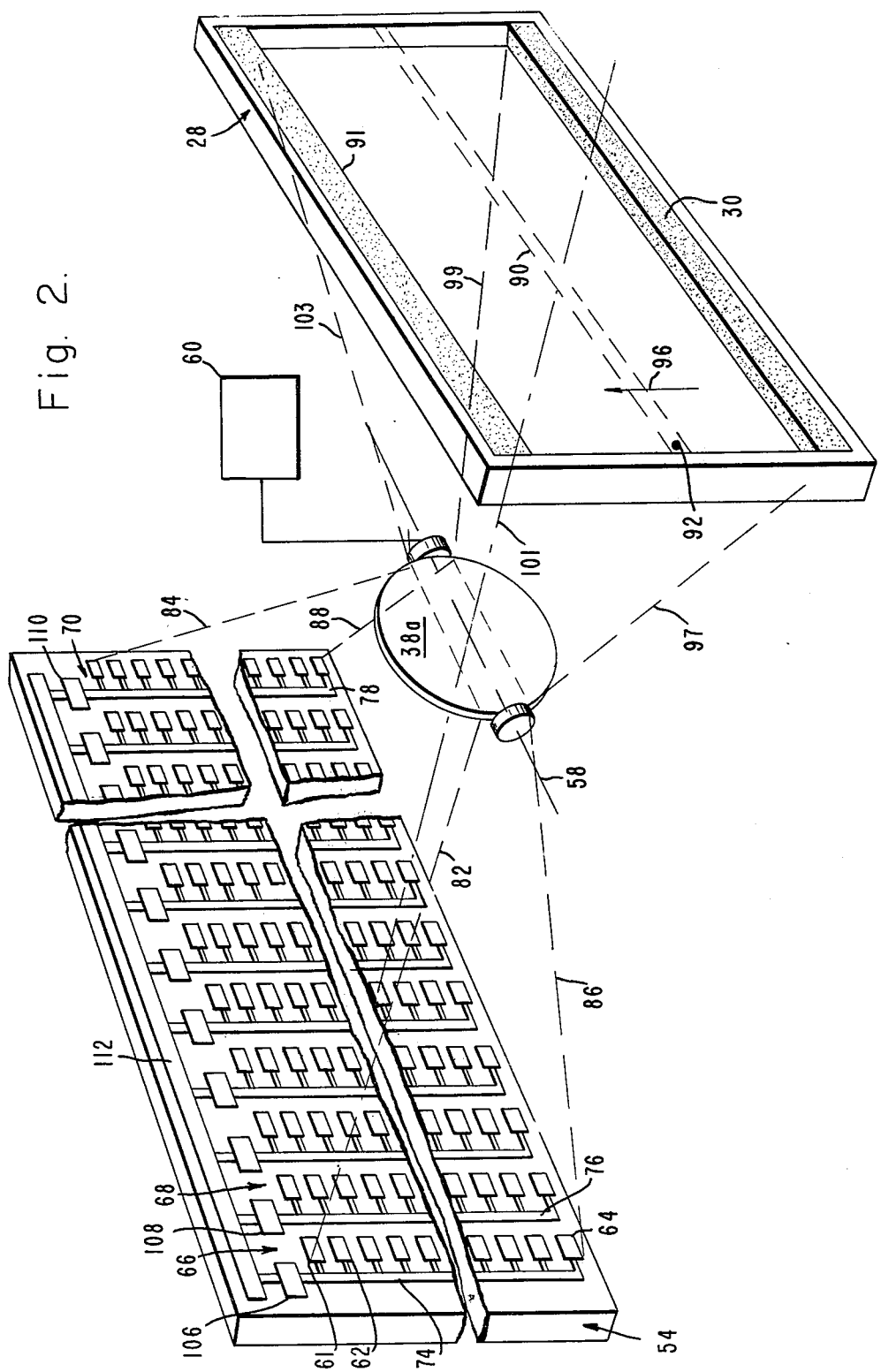

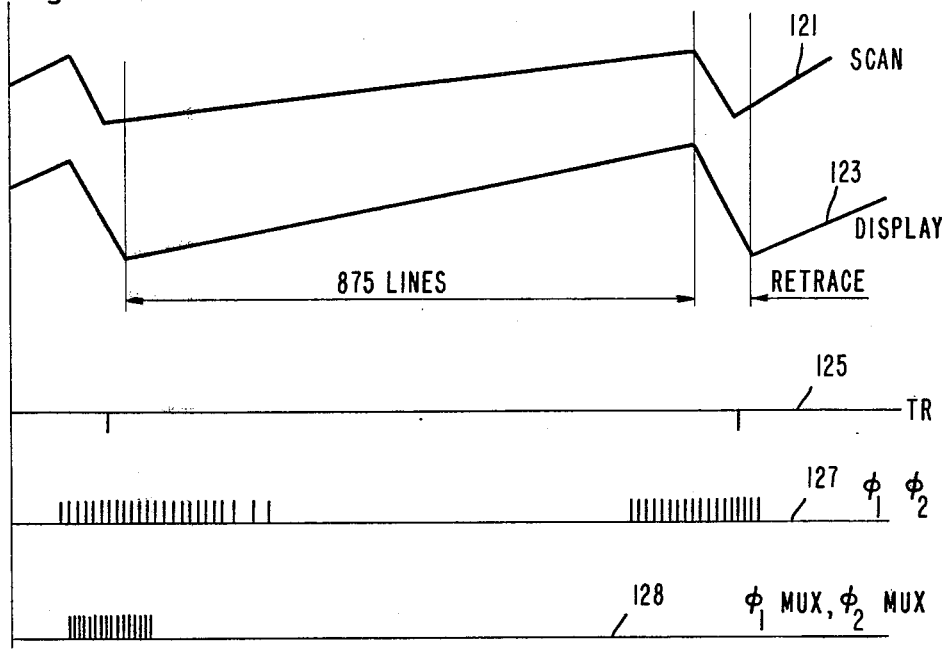
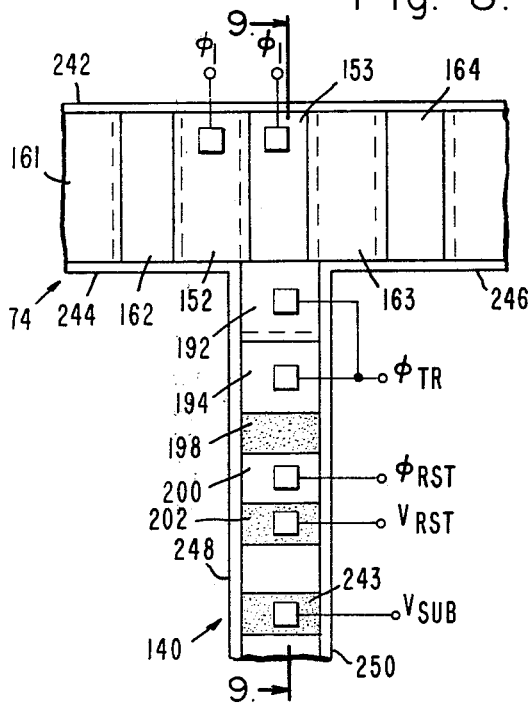
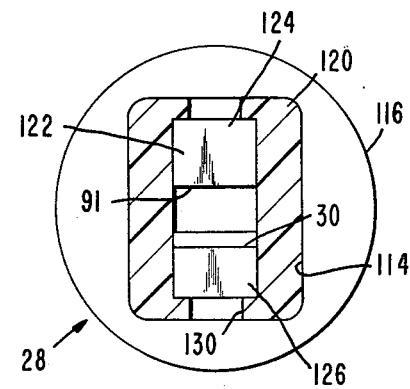

4,331,874

DC RESTORE CIRCUIT FOR CHARGE COUPLED DEVICES

TECHNICAL FIELD

This invention relates to charge coupled devices and particularly to a DC restore circuit useful for operation with a plurality of energy detectors such as an infrared detector array.

BACKGROUND OF THE INVENTION

1. Field of the Invention

A serious problem has existed in the radiation sensor field in that detectors such as IR (infrared) detectors do not all have a constant DC output for the same level of input energy. This inconsistency of detector function is a result of the inherent nature of detectors. Irregardless of manufacturing control, the DC characteristics of the detectors in any group varies when the detectors are arranged in an array and read out for display, the inconsistency of characteristics resulting in streaks in the display. A further problem with CCD circuits is that circuit inconsistencies result in charges from different columns of an array having different DC levels. Accordingly, an arrangement that would compensate for detector and circuit inconsistencies such as in a scanned detector array utilizing CCD (Charge Coupled Device) processing would be a substantial advance in the art.

2. Description of the Prior Art

No prior arrangements are known to overcome the problem of the inconsistency of detectors in an array except by testing a number of detectors and selection of individual detectors so that they have approximately similar DC characteristics.

SUMMARY OF THE INVENTION

It is therefore an object of this invention to provide a system that allows high resolution infrared information to be provided from a sensor array.

It is another object of this invention to provide an arrangement to overcome the effect of parameter variations between detectors or groups of detectors.

It is still another object of this invention to provide a system operable in real time for correcting the variations of response parameters between detectors or groups of detectors.

It is a further object of this invention to provide a DC restore circuit for use with CCD processing channels each receiving charges from a plurality of detectors.

It is another object of this invention to provide a DC correction circuit for use with CCD processing channels that will overcome any DC variations caused by circuit inconsistencies.

The DC restore circuit in accordance with the invention is especially applicable when a scanned IR detector array is providing scene information by transferring charge packets from a plurality of columns of detectors in a detector array through a plurality of CCD channels to a multiplexer, where the data is reformatted for display. In one arrangement in accordance with the invention, a scanning structure scans both the scene and the detector array in synchronism so that energy from the scene scans along the plurality of columns of detectors. The charges from each column of detectors are time-delay integrated by synchronizing the column scanning with the transfer of charges along each CCD channel so that each charge packet is the integral of the outputs from all detectors in a column from the same point in the scene. The charges are transferred from the plurality of CCD channels in parallel into a multiplexer at a rate sufficient to form lines of data for a display. In order to restore (normalize) the variation of detector characteristics between columns, a cold reference is scanned across all detectors during the retrace period. The system includes a split-off or by-pass channel at an output point along each channel to transfer the charge packets during the cold reference period, to a well for establishing a cold reference voltage that is maintained during the next scene scanning time. The cold reference voltage which represents the DC level of the signal provided by all detectors of that channel is applied to an electrode which controls formation of correction charges that are applied to each charge packet being transferred along that channel during the next scene scanning time. This cold reference voltage varies for each channel because of the inconsistencies of the group of detectors in a column from those in the other columns. The correction charge for each channel represents the difference between a reference level or standard that is common for all channels and the cold reference voltage which is the DC level received from that channel during the cold reference period and thus brings the DC level of each channel up to the common standard. The system of the invention further corrects for any DC variations caused by circuit variations throughout the array. Thus, any variation between channels of the combined DC detector characteristics or of circuit variations of each channel is eliminated by the system and circuit of the invention so as to provide an improved non-streaked (uniform) display.

BRIEF DESCRIPTION OF THE DRAWINGS

The novel features that are considered characteristic of this invention are set forth with particularity in the appended claims. The invention itself, both as to its organization and method of operation, as well as additional objects and advantages thereof, will be understood from the following description when read in connection with the accompanying drawing in which like reference numbers refer to like parts and in which:

FIG. 2 is a schematic diagram illustrating the scanning of a scene and a detector array in accordance with the invention;

FIG. 3 is a sectional view taken at lines 3—3 of FIG. 1;

FIG. 4 is a schematic diagram of voltage as a function of time for further explaining the scanning arrangement of FIGS. 1 and 2 in accordance with the invention.

FIG. 8 is a partially schematic plan view of a portion of the DC restore circuit for illustrating one CCD structural arrangement in accordance with the principles of the invention.

DETAILED DESCRIPTION

Figure 1:
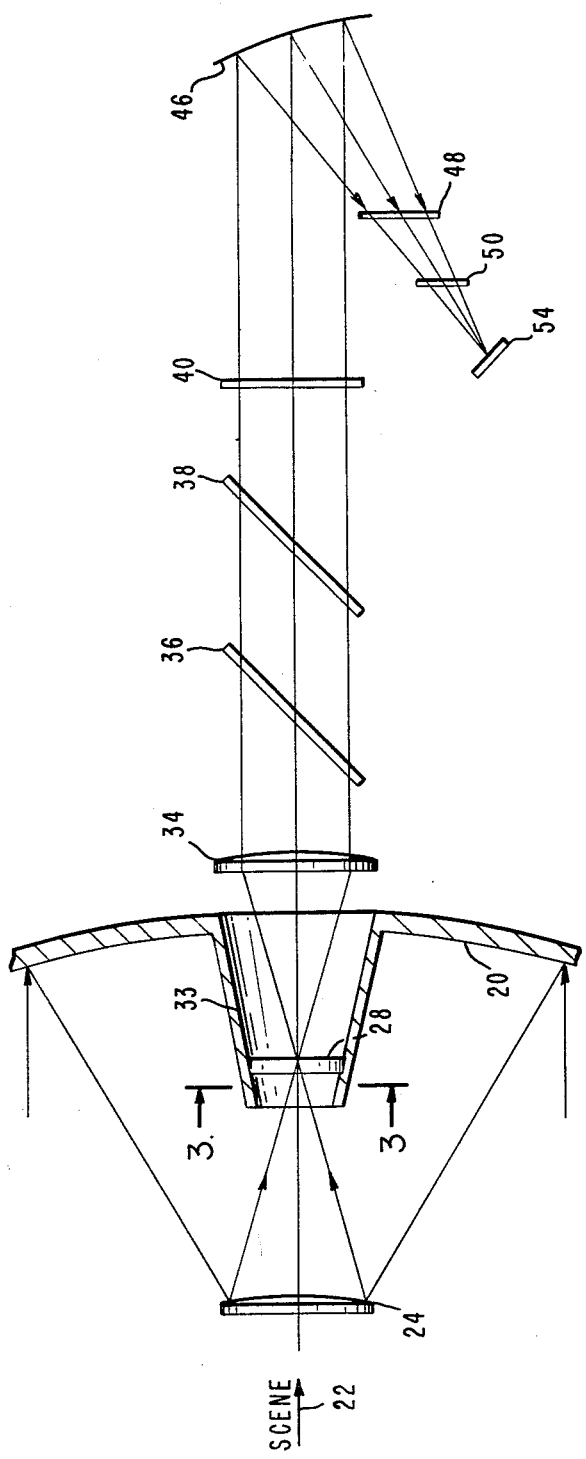
FIG. 1 is a schematic diagram of a scanning arrangement with which the DC restore circuit in accordance with the invention may be utilized.

Referring first to FIGS. 1 and 2 the overall scanning operation of the system in accordance with the invention and the development of a cold surface reference for DC restoration will be explained, prior to explaining the details of the DC restoration circuit. The system as shown in FIG. 1 may include a mirror 20 having a reflective surface receiving IR energy from a scene indicated by an arrow 22. The energy is then reflected from the mirror 20 to a mirror 24 having a convex reflective surface to focus the energy at a field stop 28 which includes a cold plate reference structure 30 as can be seen in FIG. 2. The mirror 20 has an opening at the axis thereof and is connected to a baffle 33 which may support the field stop 28. The energy is then passed through a suitable focusing lens 34 and sequentially through control mirrors 36, 38 and azimuth stabilization mirror 40. The mirror 38 controls the scanning in the elevation dimension and the mirrors 36 and 40 function for properly positioning the scanning relative to the system axis. Although the mirrors 36, 38 and 40 are only shown schematically this type of scanning with suitable optics is well known in the art. The energy is then reflected from a mirror 46 and passed through suitable optics such as folding mirrors 48 and 50 to a detector array 54 which includes columns and rows of detectors with the detectors in each column coupled to a CCD (Charge Coupled Device) channel.

Referring now principally to FIG. 2, the elevation scanning mirror and the folding mirrors 48 and 50 are shown as a scanning structure 38a for the purpose of further explaining the scanning relationship of the scene as provided through the field stop 28 to the detector array 54. It is to be understood that the elevation scanning mirror 38 may include a combination of mirrors and optics with at least one mirror 38 being oscillated to provide the scanning. In the illustrated system the scene is scanned upward and suitable mirror structures are provided so that the array is also scanned upward. The scanning portion of the structure 38a oscillates on an axis 58 in response to a suitable scan control source 60. The detector array 54 includes a plurality of infrared detectors such as 61, 62 and 64, arranged in columns such as columns 66, 68 and 70, each column having a plurality of detector rows such as 16 rows, for example. The detectors of each detector column such as 66, 68 and 70 continually provide detector current to potential wells of corresponding Charge Coupled Device (CCD) channel such as respective channels 74, 76 and 78. By synchronizing the scanning of the detectors by the mirror structure 38a with the CCD transfer gate pulses in the channels such as 74, 76 and 78, a line 90 of information of the scene adds current to the same CCD charge packets in each detector column as the scene is scanned up and the detector array 54 is scanned up over different detector positions. The scanning structure 38a includes sufficient optics so that the scene received from the field stop 28 is continually moved upward from top to bottom across the entire surface of the array. The bottom of the scene received through the stop 28 is first applied to the bottom of the array 54 at dotted lines 86 and 88 and then as the scanning proceeds, the entire scene moves upward across the array until the top of the scene is past the position of the dotted lines 82 and 84. The scanning of the field stop 28 is from bottom to top as shown by an arrow 96, with the scan field as shown by dotted lines 97 and 99 at the bottom and dotted lines 101 and 103 at the top starting the scan below an aperture 91 and scanning up, sequentially including more of the scene until at the position shown, all of the scene is received by the mirror structure 38a. As the scan of the scene continues up, less of the scene is received by the mirror structure 38a until the last line of the scene at dotted lines 97 and 99 is swept upward across the top row of detectors such as 61, completing an array scan period. The flyback period follows, which is flyback of the scanning structure 38a, in turn followed by a scan period which initially scans the cold reference stop 30. It is during scanning of this cold reference surface that one or more lines of energy from the surface of the cold reference 30 are scanned upward across all rows of detectors of the array 54. Thus, a column of 16 time delay integrated charges are transferred out of each column channel such as 66, 68 and 70 with one charge packet of each column channel being utilized to provide a correction value for correcting the DC level of the charges from each column during the next field stop scan period. During this period of transferring the 16 charges out of each column channel to provide a reference charge, a field line has moved from the bottom row of detectors such as detector 64 to the top row of detectors such as detector 61 in synchronism with the movement of the scan line along the surface of the cold reference 30.

Thus, the CCD channels are driven at a rate so that any line of the scene or the surface of the cold reference structure 30 is scanned across all 16 rows of detectors from the bottom row to the top row of detectors during 16 bit transfer periods of the CCD channels such as 74. After the cold reference scanning period has been completed, the scanning structure 38a performs another scene scanning cycle which is followed by another cold reference period after the next flyback period.

For further explaining the scan operation, a single line of scene information as shown by the line 90 of the field of view being scanned, moves from the bottom to the top of the rows of detectors in the array 54 in 16 bit transfer periods. Simultaneously, all lines of the scene being received by the structure 38a are moving upward across the array and the charges are being transerred up the CCD channels with each row of charges that is shifted into a multiplexer 122 forming a line that may be displayed. The relative rate of movement between scanning the scene and scanning of an entire column of detectors is selected so that a suitable number of lines are transferred into the multiplexer 112 for forming the desired number of horizontal lines of data from the entire scene for display. The multiplexer 112 shifts out a line of data at a high rate compared to the shifting rate of the column channels when a line of charges is being transferred into the multiplexer 112. Thus, the lines of data from the scene are formed in the multiplexer 112 with each line being a line of charges and with each charge being the time integrated value of 16 detector outputs when receiving energy from the same element of the scene such as a pixel element 92. Each CCD transfer channel such as 74, 76 and 78 includes a DC restore circuit such as 106, 108 and 110 for receiving a cold reference charge and forming correction charges for overcoming the DC variations of detector and circuit parameters between different columns of detectors.

Referring now to FIG. 3 taken at line 3—3 of FIG. 1, the field stop 28 includes a round heat sink structure 116 which may be of copper having an opening 114 retaining an insulation structure 120. The field opening or aperature 91 is centered in an internal structure 122 which has a conductive top structure 124 forming the upper edge and a thermoelectric coller 126 at the bottom thereof. The cold plate structure 30 is positioned between the field stop aperture 91 and the thermoelectric cooler 126 for providing the cold reference to the detectors when being scanned and for forming the lower edge of the field stop aperture 91. The cooler 126 is not limited to a thermoelectric cooler and may be any suitable type including a cold finger receiving compressed gas from a suitable source (not shown) through an opening such as 130. It is to be noted that the invention is not limited to the illustrated arrangement for providing a cold reference but may include any suitable arrangement such as one providing a cold plate that is movable in front of the detector array during retrace time.

Referring now to the waveforms of FIG. 4 as well as to FIG. 2, the overall timing of the system will be explained in further detail. A scan waveform 121 which may represent the scan control from the source 60 for the scanning structure 38a includes a field scan period and a retrace period. A display scan waveform of a waveform 123 includes a line scanning period during which 875 lines, for example, are formed for continuous display and a retrace period which, in the illustrated system, is of sufficient time for flyback as shown by the waveform 121 and for transferring at least one charge along 16 detectors for providing an integrated cold reference charge. It is to be noted that the display scan signal of the waveform 121 may be delayed in time relative to the waveform 123 but is shown without a delay for ease of understanding. The TR pulses of a waveform 125 transfer the first integrated charge into the DC restore circuits such as 106 for comparison with a reference for correcting the DC level during the next scan period. The CCD channels such as 66, 68 and 70 are driven by $\phi_1$ and $\phi_2$ pulses indicated as a single waveform 127. It is to be noted that the $\phi_1$ and $\phi_2$ pulse rate determines that the illustrated 875 lines of charges are transferred into the multiplexer 112 during each scan time. The multiplexer CCD driving signals $\phi_1$ MUX and $\phi_2$ MUX which are illustrated by a waveform 128 as a single signal, have a rate which is a multiple N of the rate of the $\phi_1$ and $\phi_2$ pulses. Because the entire number of charge packets shifted into the multiplexer 112, which is 500 in the illustrated system, must be transferred out of the multiplexer 112 before the next $\phi_1$ and $\phi_2$ pulses, N is equal to 500 plus a rate to provide a period for display retrace. Each charge along a line of data represents a resolution element or pixel for display. The multiplexer pulses of the waveform 128 are gated off during the short period when charges are being transferred therein from the column channels.

Figure 5:
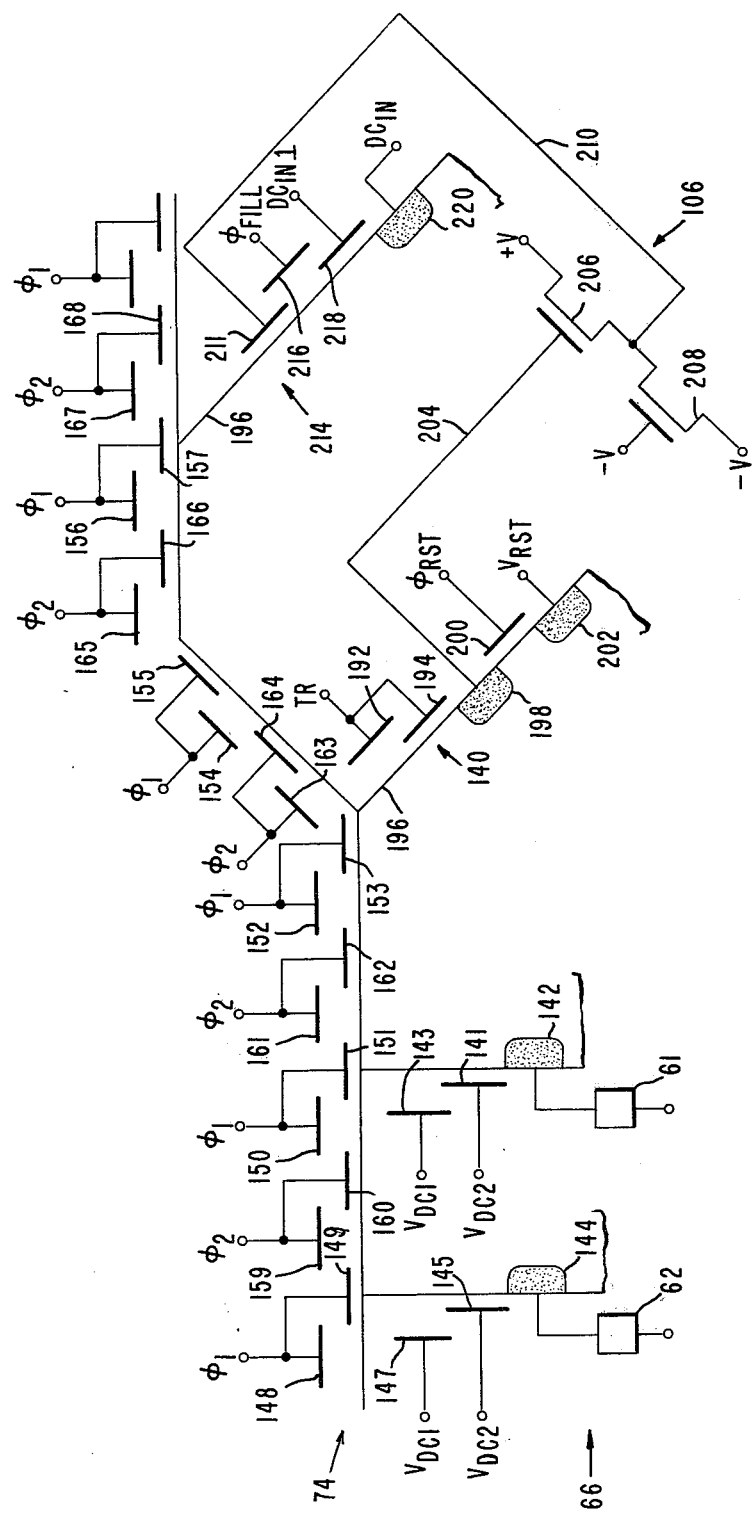
FIG. 5 is a schematic diagram illustrating the DC restore circuit in accordance with the invention.

Referring now to FIG. 5 which is an illustrative portion of the detector channel 66, the CCD transfer channel 74 and the DC restore circuit 106, the operation of the system of the invention will be further explained. The CCD data channel 74 continually receives charges from detectors such as 61 and 62 and all charge packets are transferred along the channel, time delay integrated and then directed into the multiplexer 112 except for a a selected reference charge which is shifted into a split-off channel 140. The detectors 61 and 62 as well as the other detectors of the column 74 continually transfer detector current to corresponding diffusion regions such as respective P+ diffusion regions 142 and 144, which in turn transfer charges to positions under respective $\phi_1$ electrodes 151 and 149 when the voltage $\phi_1$ is at a low potential. Electrodes 141 and 143 and the similar electrodes 145 and 147 receive DC bias potentials $V_{DC2}$ and $V_{DC1}$, selected so that the charge packets are transferred to wells under respective electrodes 151 and 150 and electrodes 149 and 148 when the potentials thereon go to a low value. The driving arrangement along the data channel 74 is illustrated for two phase driving with alternate pairs of electrodes receiving $\phi_1$ and $\phi_2$ pulses which have alternating voltage levels, with each $\phi_1$ and $\phi_2$ pulse train alternating to levels opposite from the other. Along the channel 74, the $\phi_1$ electrodes are pairs of electrodes such as electrodes 148 to 157 and the $\phi_2$ electrodes are pairs of electrodes such as electrodes 159 to 168. The channel 74 continues in a similar manner to the multiplexing channel 112 (FIG. 2).

As discussed relative to FIGS. 1 and 2, the scanning of the detector column 66 is in synchronism with the transfer of charge packets by the $\phi_1$ and $\phi_2$ pulses along the channel 74 so that a single point from the scene sequentially illuminates each detector of the column 66, which then provides detector current, as a specific charge packet is transferred to the wells connected to the detectors. Thus, with 16 detectors in the channel 66, a time delay integrated charge packet representing radiation from a single point of the scene being scanned, is transferred from under the the electrodes 151 and 150 after 16 bit transfer periods.

The split off or by-pass channel 140 of the correction circuit 106 includes TR electrodes 192 and 194 positioned relative to a substrate 196 so as to split from the channel 74 under the $\phi_1$ electrodes 152 and 153 in the illustrated system. The TR electrodes 192 and 194 provide during a selected time of the retrace period or after the scanner flyback period, a potential lower than the low level of the $\phi_1$ pulses. Upon activating the TR signal during a two phase transfer cycle, the integrated charge packet under the electrodes 152 and 153 repesenting the response of 16 detectors to the cold reference source, is transferred to a P+ diffusion region 198. The by-pass channel 140 also includes a $\phi_{RST}$ electrode 200 responsive to a reset pulse $\phi_{RST}$ and a P+ diffusion region 202 coupled to a $V_{RST}$ potential for removing the charge from the P+ region 198 during the occurrence of a low level reset pulse $\phi_{RST}$. The potential provided by the reference charge stored in the diffusion region 198 is applied through a lead 204 to the gate electrode of a Field Effect Transistor (FET) 206, which with a FET 208 forms a source follower circuit. The drain electrode of the FET 206 is coupled to a suitable +V potential, the source electrode of the FET 206 is coupled to the drain electrode of the FET 208 and to a correction C lead 210, the source electrode of the FET 208 is coupled to a suitable −V potential and the gate electrode of the transistor 208 is coupled to the same −V source of potential.

For providing correction charges for use to increase the integrated charge packets resulting from the next scan to a common DC level, a correction electrode 211 is provided along the substrate 196 of a correction channel 214 and is coupled to the C lead 210. A $\phi_{FILL}$ electrode 216 and a $DC_{IN1}$ electrode 218 allow, during each two phase clock period, transfer of a charge under the electrodes 211 and 216 from a P+ diffusion region 220. A $DC_{IN}$ voltage source is coupled to the diffusion region 220. The $DC_{IN1}$ reference voltage periodically applied to the electrode 218 represents a reference level that may correspond to the greatest integrated charge value that will be derived from any of the columns of detectors when scanning the scene. When a correction charge is formed under the correction electrode 211, it is transferred, to a position under the channel electrodes 156 and 157 when the $\phi_1$ pulse goes to a low level.

Figure 6:
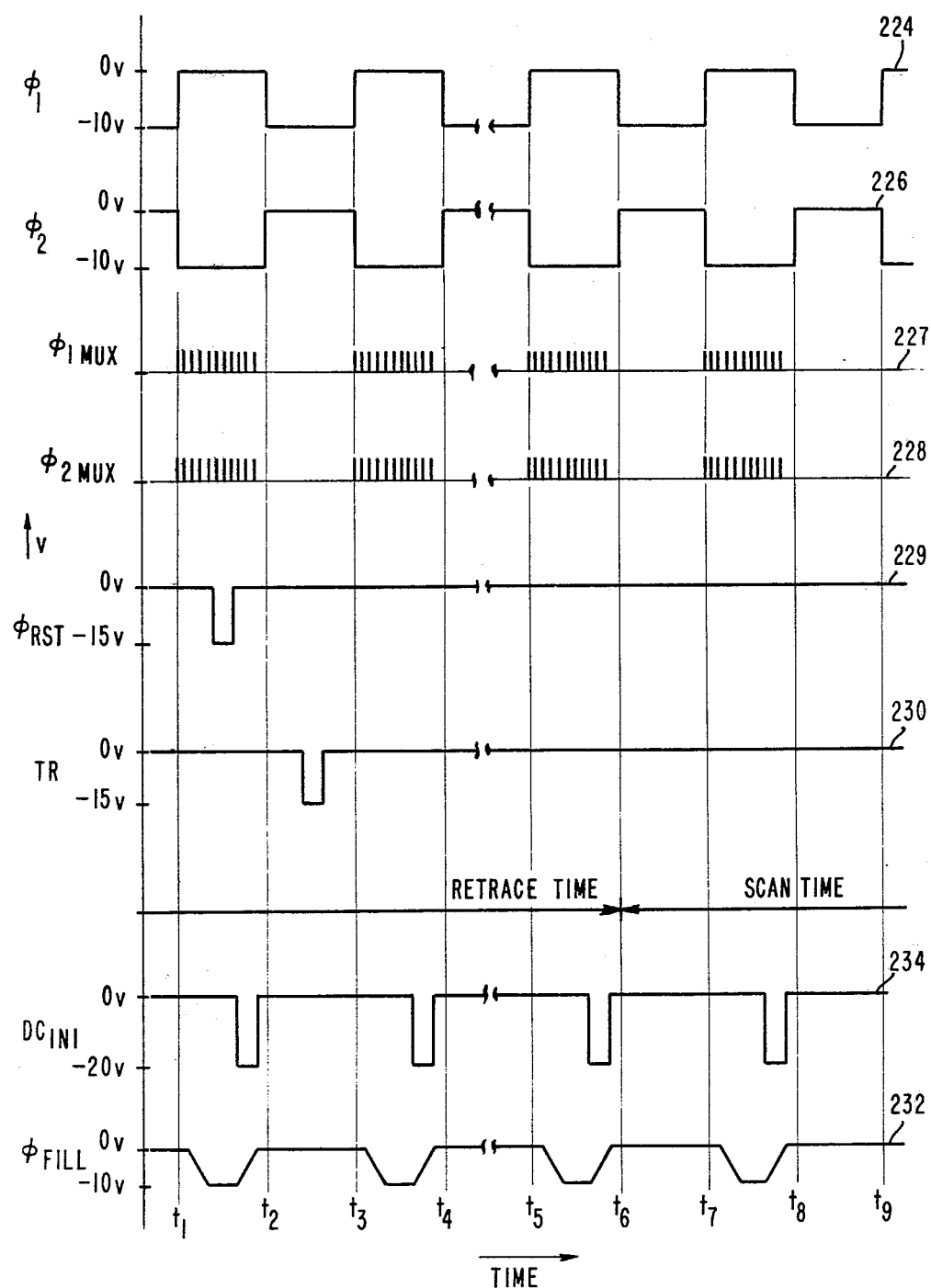
FIG. 6 is a timing diagram of voltage as a function of time for further explaining the operation of the DC restore circuit of FIG. 5.
Figure 7A:
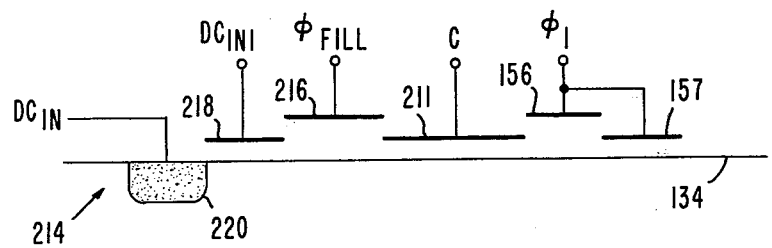
FIGS. 7a to 7d are schematic diagrams showing a portion of the DC restore circuit and the potential profiles provided during its operation.
Figure 7B:
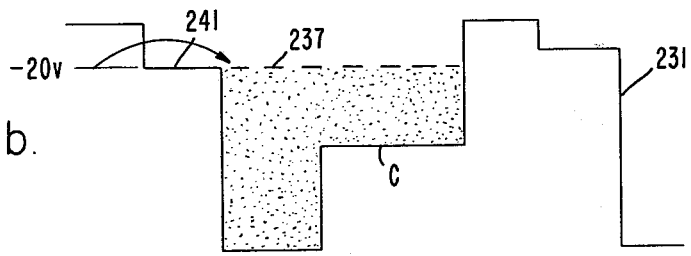
Figure 7C:
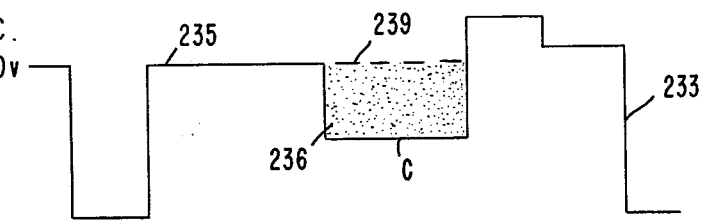
Figure 7D:
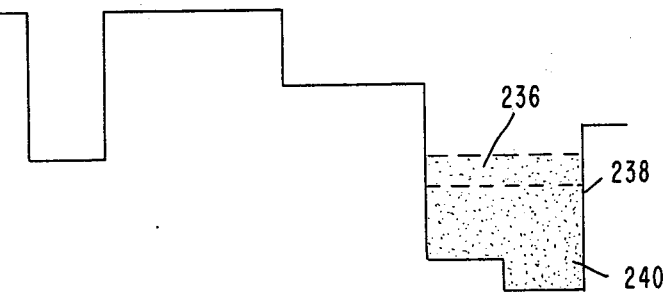

Referring now also to the waveforms of FIG. 6 as well as to FIG. 5, the $\phi_1$ and $\phi_2$ driving pulses are shown by respective waveforms 224 and 226 and are out of phase as they change levels between 0 V and $-10$ V at times $t_1$ to $t_9$. Each bit time or two full clock periods of both of the $\phi_1$ and $\phi_2$ waveforms transfers a charge packet between the $\phi_2$ and $\phi_1$ electrodes of the channel 74 and to wells under the electrodes such as 148 and 149, 150 and 151, and 152 and 153. At a selected time of the retrace period after time $t_1$, a $\phi_{RST}$ pulse of a waveform 229 is applied to the electrode 200 at $-15$ volts to remove the charge from the diffusion region 198. This $\phi_{RST}$ pulse is applied after the last integrated scene charge has been transferred from under the electrode 157. It is to be noted that this charge in the diffusion region 198 has remained stored during the previous retrace time after its establishment, during the previous active or live scan time and during the delay period while the charges are transferred from the detectors to the multiplexer. After the time $t_2$, a TR gating pulse of a waveform 230 is applied at a low voltage of $-15$ volts to the TR transfer gates 192 and 194 when the $\phi_1$ pulse of the waveform 224 is at its low level so as to transfer a cold reference charge from under the electrodes 152 and 153 into the diffusion region 198. The charge packet under the electrodes 152 and 153 at the time of the TR pulse of the waveform 230 is preferably the first charge from integrating all 16 detectors, that is gated into the well under the electrodes 152 and 153. This charge packet which represents an integrated value from the column of detectors establishes the correction voltage C on the lead 210 representative of the cold level or DC charge provided by a contribution from all of the detectors in the column 74. After the time $t_3$, the $\phi_{FILL}$ pulse of a waveform 232 falls to a low of $-10$ volts and the $DC_{IN1}$ pulse of a waveform 234 transfers a charge from the diffusion region 220 into a differencing well under the electrode 216. The $\phi_{FILL}$ pulse of the waveform 232 then slowly rises while the $DC_{IN1}$ pulse is low at $-20$ volts, spilling the excess charge back under the electrodes 216 and 218 into the diffusion region 220. The charge remaining under the electrode 211 is a DC correction charge representing the difference between the reference voltage and the correction voltage C, which is then transferred under the electrodes 156 and 157 when the $\phi_1$ pulse of the waveform 224 goes to its low level. It is to be noted that this transfer of a correction charge into the channel 74 occurs when the $DC_{IN1}$ pulse of the waveform 234 is at a high level. This DC correction operation occurs each two phase clock period and is continuous with the restored charge only being utilized for display during the transfer under the electrodes 167 and 168 of charges resulting from integration of the 16 detectors during the scene scan time. The $\phi_1$ MUX and $\phi_2$ MUX signals shown by waveforms 227 and 228 allow transfer of signal charges into a multiplexing register, 112, which performs a parallel to serial transform for eventual display of each line.

Referring now to FIGS. 7a to 7d as well as to FIGS. 5 and 6, a side view of the channel 214 is shown to further explain the differencing operation for providing the DC correction charges to the main data channel 74. A profile 231 shows the wells under the electrodes 216 and 211 filled from diffusion region 220 to a level 237 shortly after the $DC_{IN1}$ pulse of the waveform 234 goes negative to $-20$ volts. Because a $DC_{IN1}$ level 241 represents a reference value of $-20$ volts, the amount of charge under the electrodes 216 and 211 is established to the level 237 from the source of the region 220 which is at a high potential level, relative to the $-20$ volts. The transferred charge is an amount equal to the maximum that the column of detectors will provide for a given cold detector reference condition. As the $\phi_{FILL}$ pulse of the waveform 232 slowly rises during the occurrence of the negative $DC_{IN1}$ reference pulse, the excess charge is spilled over the $DC_{IN1}$ reference level into the diffusion region 220 which is biased at the 0 volt high level of the waveform 232. When the $\phi_{FILL}$ pulse of the waveform 232 rises to the upper level of 0 volts as shown by a profile 233, a difference or correction charge 236 has a level 239 the same as a level 235 under the electrode 218. The correction charge 236 has a value that is a function of the difference between the charge established by the reference $DC_{IN1}$ and the charge established by the correction voltage C. The bottom of the well holding the correction charge 236 is established by the correction voltage C, which voltage is maintained during the entire scene scanning time. This arrangement allows a charge packet to be provided each two phase clock period that is always positive for all values of C because of the selection of the $DC_{IN1}$ reference value 241 (maximum response to the cold reference). By the illustrated mechanism, the positive correction charge is provided as a function of C and is referenced to the maximum integrated charge that would occur for a column of detectors responding only to background during normal scene detection operation. A potential profile 238 shows the total charge under the electrodes 156 and 157, which total charge includes a time delay integrated scene charge 240 and the correction charge 236.

Referring now to FIG. 8, a plan view is shown which is an illustrative branch of the channel 74 as one of several suitable branching structures. The channel 74 includes suitable diffused stops 242, 244 and 246 and the split-off channel 140 includes suitable diffused stops 248 and 250. The channel 140 is shown as including a diffusion region 243 for illustrating a suitable biasing arrangement for the substrate material.

Figure 9:
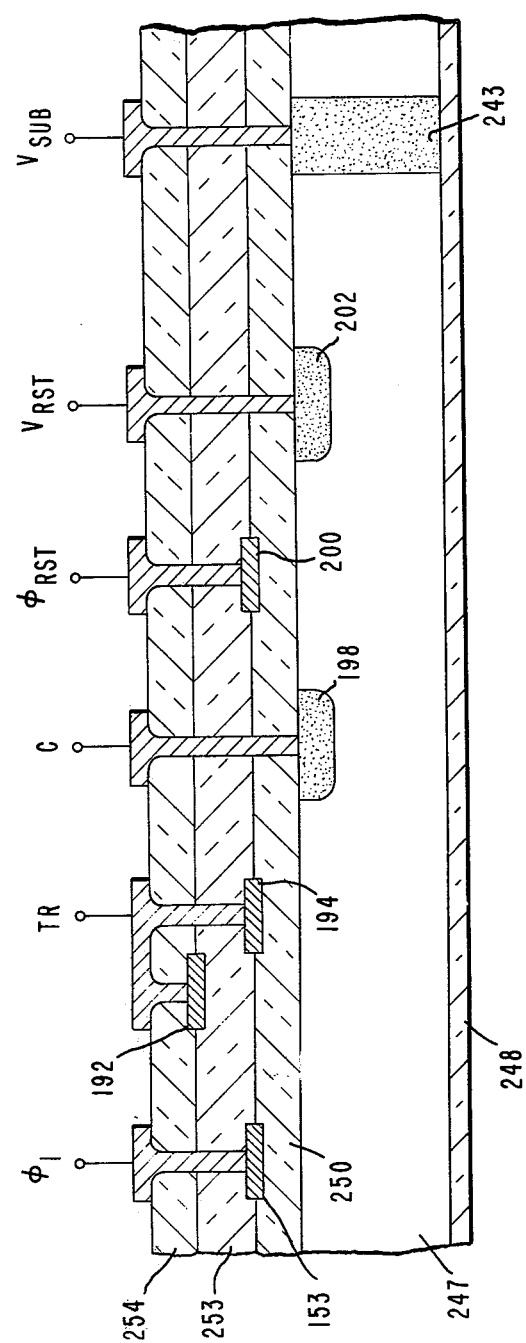
FIG. 9 is a sectional view taken at lines 9—9 of FIG. 8 for further illustrating the structural arrangement of the DC restore circuit in accordance with the invention.

Referring now also to FIG. 9 which is a section taken at line 9—9 of FIG. 8, the illustrated structure is constructed on an n type substrate 247 which has an n+ backside diffusion 248 deposited on the under side of the channel. The diffusion regions 198 and 202 which are p+ type and the biasing diffusion region 243 which is of an n+ type, are first established in the substrate 247 as is well known in the art. A first silicon dioxide layer 250 is then deposited on the substrate 247 leaving openings for the conductors to pass to the diffusion regions 198, 202 and 243. In the next operation, electrodes 153, 194 and 200 are deposited of a polysilicon gate material. A second silicon oxide layer 253 is then deposited leaving openings for conductors to the electrodes 153, 194 and 200 as well as to the diffusion regions 198, 202 and 243. The upper layer of electrodes is then deposited which in the illustrated channel is the TR electrode 192 also of polysilicon. A third silicon dioxide layer 254 is then deposited leaving holes for the previously discussed conductors as well as a conductor to the electrode 192. The next operation is to deposit the conductors as shown which may be of an aluminum material. Suitable leads are then attached to the aluminum conductors. The remainder of the structure of the system of the invention is formed in a manner similar to that shown in FIGS. 8 and 9 need not be discussed in further detail. It is to be noted that the structure described is only illustrative and any suitable arrangement may be utilized in accordance with the principles of the invention such as the substrate 247 being an epitaxial growth material.

Thus, there has been described a DC restore circuit for CCD channels operating with an array of scanned detectors arranged in columns and rows. For each column there is a DC level which has been found to vary between columns with the particular detectors that are utilized as well as with variations in the CCD signal processing circuitry associated with the detectors. In order to avoid streaks in the display, it has been found necessary to standardize the DC level of the outputs for each channel, which is reliably and accurately performed by the system of the invention. During the retrace portion of the display scan the DC level of each channel is detected against a standard cold surface which is the same for all channels. A charge is then formed relative to a DC level that is common to all channels, and is added to the integrated detector outputs during the scanning period in order to increase the DC level of that channel up to the standard.

What is claimed is:

1. In a detector array system responsive to a scene and having a plurality of CCD data channels each receiving charges derived from a different line of detectors of a detector array, a system for establishing data charge packets transferred from each of said CCD channels to a value referenced to a common DC level comprising:

first means for applying cold reference energy to said detector array; and a plurality of correction circuits including for each of said data channels:

a split-off channel coupled to said data channel and including gating means and charge storage means, said gating means transferring a selected charge packet to said charge storage means representative of the DC response of said line of detectors when said cold reference energy is applied to said detector array, said charge storage means providing a correction voltage, and charge generating means coupled between said charge storage means and said data channel for transferring a correction charge representative of the difference between said common DC level and said correction voltage to said data charge packets being transferred along said data channel so that said data charge packets are referenced to said common DC level.

2. The combination of claim 1 in which said first means includes scanning means having a scan period followed by a flyback period for applying energy from said scene to said detector array during a majority of said scan period and applying said cold reference energy to said detector array during a first portion of said scan period, said charge storage means including means for transferring said selected charge packet to said storage means during the first portion of said scan period and storing said selected charge during the majority of said scan period for providing said correction voltage.

3. The combination of claim 2 in which said first means further includes a cold surface for said scanning means to scan during the first portion of said scan period for providing said cold reference energy.

4. The combination of claim 3 further including channel driving means coupled to each of said data channels for transferring said data charge packets therealong at a rate in synchronism with said scanning means so that data charge packets transferred along said channel receive charges from each detector of said line of detectors from the same point of said scene or of said cold surface, said correction voltage representing the DC level of an integrated charge from each of said line of detectors when said data charge packets include charges derived from each detector of said line of detectors receiving energy from said cold surface.

5. The combination of claim 1 in which said charge generating means includes a substrate, means for forming a potential well in said substrate having a charge capacity referenced between said correction voltage and said common DC level, and means for repetitively providing a charge to said well for being applied to each data charge packet transferred along said data channel.

6. The combination of claim 5 in which said means for repetitively providing a charge includes a diffusion region, a reference electrode positioned adjacent to said substrate and between said diffusion region and said potential well, a source of pulses coupled to said reference electrode for alternately applying a low potential and said common DC level to said electrode, and a fill electrode positioned adjacent to said substrate and between said reference electrode and said well for alternately applying a low potential for increasing the well capacity to receive charges when said reference electrode is at said low potential and for providing a high potential when said reference electrode is at said common DC level so as to establish said correction charges in said well.

7. The combination of claim 6 in which said system includes a cold reference surface and said scanning means has a scan period and a flyback period for applying energy from said cold reference surface to said detector array during a first portion of said scan period and energy from said scene to said detector array during a second portion of said scan period, said gating means including means for transferring said selected charge to said storage means during the first portion of said scan period for storing said selected charge packet during the second portion of said scan period for providing said correction voltage.

8. The combination of claim 5 in which said split-off channel includes a substrate;

said gating means includes transfer electrode means positioned adjacent to said substrate for transferring a selected charge packet from said data channel; and said charge storage means includes a first diffusion region in said substrate for storing said selected charge and providing said correction voltage, a second diffusion region in said substrate, and a reset electrode positioned adjacent to said substrate and between said first and second diffusion regions for removing the selected charge from said first diffusion region prior to transferring the next selected charge packet from said data channel.

9. A system responsive to scene radiation applied to a detector array for providing a constant DC reference level to CCD charge pulses derived from detector means and transferred along a data channel comprising:
   scanning means for providing a reference level of radiation to said detector means during a first period and providing scene radiation to said detector array during a second period;
   bypass means coupled to said data channel for transferring a charge packet thereto during said first period;
   storage means coupled to said bypass means for receiving the transferred charge packet and provide a correction voltage; and
   charge forming means coupled to said storage means and to said data channel and including differencing means for providing correction charges to said charge packets in said data channel during said second period, said correction charges being representative of the difference between said constant DC reference level and said correction voltage, so that said charge packets transferred along said data channel during said second period are referenced to said constant DC reference level.

10. A system for restoring CCD data charge packets to a common reference level in a system including an array of a plurality of columns of detectors, a plurality of CCD data channels, each coupled to one of said column of detectors, and scanning means for providing to said plurality of columns of detectors, scene energy during a second period to form said data packets and cold reference energy during a first period to form reference charge packets, comprising for each data channel;
   first means coupled to said data channel for storing a reference charge packet during said first period, derived from said cold reference energy, and second means coupled to said first means and to said data channel for responding during said second period to said reference charge packet to provide correction charges for restoring data charge packets provided by said column of detectors from said scene energy to said common reference level, whereby data charge packets in said plurality of data channels are referenced to said common reference level.

11. The combination of claim 10 in which said scene energy is derived from a scene and said cold reference energy is derived from a cold reference source and further including driving means coupled to said plurality of data channels and synchronized with said scanning means so that in each data channel, each data charge packet and reference charge packet represents an integral of detector current from each detector of said corresponding column of detectors responding to the same resolution spot of said respective scene and said cold reference source.

12. A DC restore circuit for restoring the DC level of data charge packets in a CCD data channel receiving from detector means, said data charge packets and reference charge packets representing a DC level of said detector means in response to cold reference energy, comprising:
   a substrate material;
   a split-off channel including a first diffusion region on said substrate material first and second gating electrodes positioned adjacent to said substrate for gating said reference charge packets from said data channel into said first diffusion region and providing a correction voltage;
   a correction electrode and a fill electrode positioned adjacent to said substrate material, said correction electrode being responsive to said correction voltage for forming a first potential well, said first potential well being coupled to said data channel;
   a reference electrode positioned adjacent to said substrate and adjacent to said fill electrode;
   a second diffusion region positioned adjacent to said substrate and adjacent to said reference electrode;
   a source of fill pulses coupled to said fill electrode for periodically forming a second potential well in said substrate connected to said first potential well, said second potential well receiving charges from said second diffusion region in response to said fill pulses; and
   a source of reference pulses coupled to said reference electrode for providing a low voltage at a reference level concurrent with a trailing edge of one of said fill pulses for transferring excess charge from said second potential well to said second diffusion region for establishing a correction charge in said first potential well for being transferred to a data charge packet in said data channel.

* * * * *